United States Patent
Jarrot

(10) Patent No.: US 10,337,318 B2
(45) Date of Patent: Jul. 2, 2019

(54) SENSOR ARRAY NOISE REDUCTION

(71) Applicant: SCHLUMBERGER TECHNOLOGY CORPORATION, Sugar Land, TX (US)

(72) Inventor: Arnaud Jarrot, Somerville, MA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 662 days.

(21) Appl. No.: 14/517,197

(22) Filed: Oct. 17, 2014

(65) Prior Publication Data
US 2016/0108724 A1    Apr. 21, 2016

(51) Int. Cl.
*E21B 47/12* (2012.01)
*G01R 29/26* (2006.01)
*H04B 15/00* (2006.01)

(52) U.S. Cl.
CPC ............ *E21B 47/122* (2013.01); *G01R 29/26* (2013.01); *H04B 15/00* (2013.01)

(58) Field of Classification Search
CPC ..... E21B 47/12; E21B 47/122; G01C 21/165; G01V 3/38
USPC .............................................. 702/6, 104, 189
See application file for complete search history.

(56) References Cited

U.S. PATENT DOCUMENTS

| | | | | |
|---|---|---|---|---|
| 4,980,682 A * | 12/1990 | Klein | ................... | E21B 47/122 166/66 |
| 5,651,071 A | 7/1997 | Lindemann et al. | | |
| 6,167,156 A * | 12/2000 | Antoniades | .......... | G06K 9/6232 382/100 |
| 6,370,082 B1 * | 4/2002 | Gardner | .................. | E21B 47/16 340/854.4 |
| 6,781,521 B1 | 8/2004 | Gardner et al. | | |
| 6,837,332 B1 * | 1/2005 | Rodney | ..................... | G01V 1/48 181/0.5 |

(Continued)

FOREIGN PATENT DOCUMENTS

| WO | 03013215 A2 | 2/2003 |
|---|---|---|
| WO | 2007127182 A2 | 11/2007 |

OTHER PUBLICATIONS

International Search Report issued in related PCT application No. PCT/US2015/055545 dated Jan. 25, 2016, 3 pages.

(Continued)

*Primary Examiner* — John E Breene
*Assistant Examiner* — Jeffrey P Aiello

(57) ABSTRACT

Sensor array noise reduction is provided. In one possible implementation a logging and control system includes a sensor array noise reduction manager configured to receive measurements from two or more sensors and apply a selected demixing vector to filter one or more noise sources from the measurements and improve a signal to noise ratio of a telemetry signal in the measurements. In another possible implementation a sensor array noise reduction manager for improving a signal to noise ratio of a signal includes a sensor interface configured to receive the signal, which includes information associated with an operating condition, from two or more sensors. The sensor array noise reduction manager also includes a noise reduction module to simultaneously remove noise associated with one or more noise sources from the received signal through use of a demixing vector.

22 Claims, 8 Drawing Sheets

(56) References Cited

U.S. PATENT DOCUMENTS

| | | | |
|---|---|---|---|
| 7,151,466 B2 | 12/2006 | Gabelmann et al. | |
| 7,243,028 B2 | 7/2007 | Young et al. | |
| 7,570,309 B2 | 8/2009 | Zhou et al. | |
| 7,609,169 B2 | 10/2009 | Aiello | |
| 8,195,591 B1* | 6/2012 | Owechko | G06K 9/00369 |
| | | | 706/45 |
| 8,446,964 B2 | 5/2013 | Macinnis et al. | |
| 2007/0223822 A1* | 9/2007 | Haugland | G01V 11/002 |
| | | | 382/232 |
| 2009/0075846 A1* | 3/2009 | Qu | C09K 8/52 |
| | | | 507/129 |
| 2010/0039898 A1* | 2/2010 | Gardner | G01V 11/002 |
| | | | 367/82 |
| 2010/0194586 A1* | 8/2010 | Tjhang | G01V 11/002 |
| | | | 340/854.7 |
| 2015/0226058 A1* | 8/2015 | Stolpman | E21B 47/18 |
| | | | 702/9 |

OTHER PUBLICATIONS

Astolfi, A., "Optimization, an introduction", Imperial college, lecture notes, Sep. 2006, Jan. 23, 2014 (http://www3.imperial.ac.uk/pls/portallive/docs/1/7288263.PDF) pp. 1-80.

Marsaglia, G. "Choosing a Point from the Surface of a Sphere". Annals of Mathematical Statistics 43 (2): pp. 645-646 (1972).

International Preliminary Report on Patentability issued in International Patent Application No. PCT/US2015/055545 dated Apr. 18, 2017, 11 pages.

\* cited by examiner

SENSOR ARRAY NOISE REDUCTION

BACKGROUND

In electromagnetic telemetry, the presence of noise from unwanted electromagnetic sources can threaten the reliability of a telemetry uplink. Such noise can be generated by a wide variety of devices associated with electromagnetic energy including mud motors, wellhead equipment, AC units, vehicles, welding equipment, consumer electronics (including residential microwave appliances), etc.

SUMMARY

Sensor array noise reduction is provided. In one possible implementation a logging and control system includes a sensor array noise reduction manager configured to receive measurements from several sensors and apply a selected demixing vector to filter the noise sources from the measurements and improve a signal to noise ratio of a telemetry signal in the measurements. In another possible implementation, a sensor array noise reduction manager improves a signal to noise ratio of a signal through use of a sensor interface to receive the signal, which includes information associated with an operating condition, from several sensors. The sensor array noise reduction manager also includes a noise reduction module to simultaneously remove noise associated with several noise sources from the received signal through use of a demixing vector. In another possible implementation, a computer-readable tangible medium includes instructions capable of directing a processor to receive signals from two or more sensors and apply a selected demixing vector to filter one or more noise sources from the signals.

This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

In the following description, numerous details are set forth to provide an understanding of some embodiments of the present disclosure. However, it will be understood by those of ordinary skill in the art that the system and/or methodology may be practiced without these details and that numerous variations or modifications from the described embodiments may be possible.

As described herein, various techniques and technologies can facilitate the reduction of the influence of undesired noise sources in electromagnetic signals, such as for example, in improving a signal to noise ratio in an electromagnetic telemetry system. It will be understood that the term "noise reduction" as used herein includes a range of signal noise reduction, from decreasing some of the noise in a signal to cancellation of noise in a signal.

In one possible implementation, sensor array noise reduction can be accomplished through the use of multiple sensors in conjunction with a sensor array noise reduction manager utilizing a demixing vector. In one possible aspect, N sensors can be used to process N−1 noise sources from a desired signal. In another possible aspect, different noise sources can be jointly removed rather than sequentially removed from the desired signal.

In one possible implementation, sensor array noise reduction can be used in conjunction with Electromagnetic (EMAG) telemetry, including scenarios where EMAG telemetry is employed in conjunction with Measuring While Drilling (MWD)/Logging While Drilling (LWD) operations and/or in underbalanced drilling conditions, and/or when gas is used instead of mud as drilling fluid.

In some implementations, embodiments of sensor array noise reduction can be used to reduce environmental noise in EMAG telemetry and improve a reliability of an associated uplink telemetry. This can include scenarios in which EMAG telemetry power constraints result in a signal power measured at a well surface which is smaller than environmental noise present at a wellsite.

Figure 1:
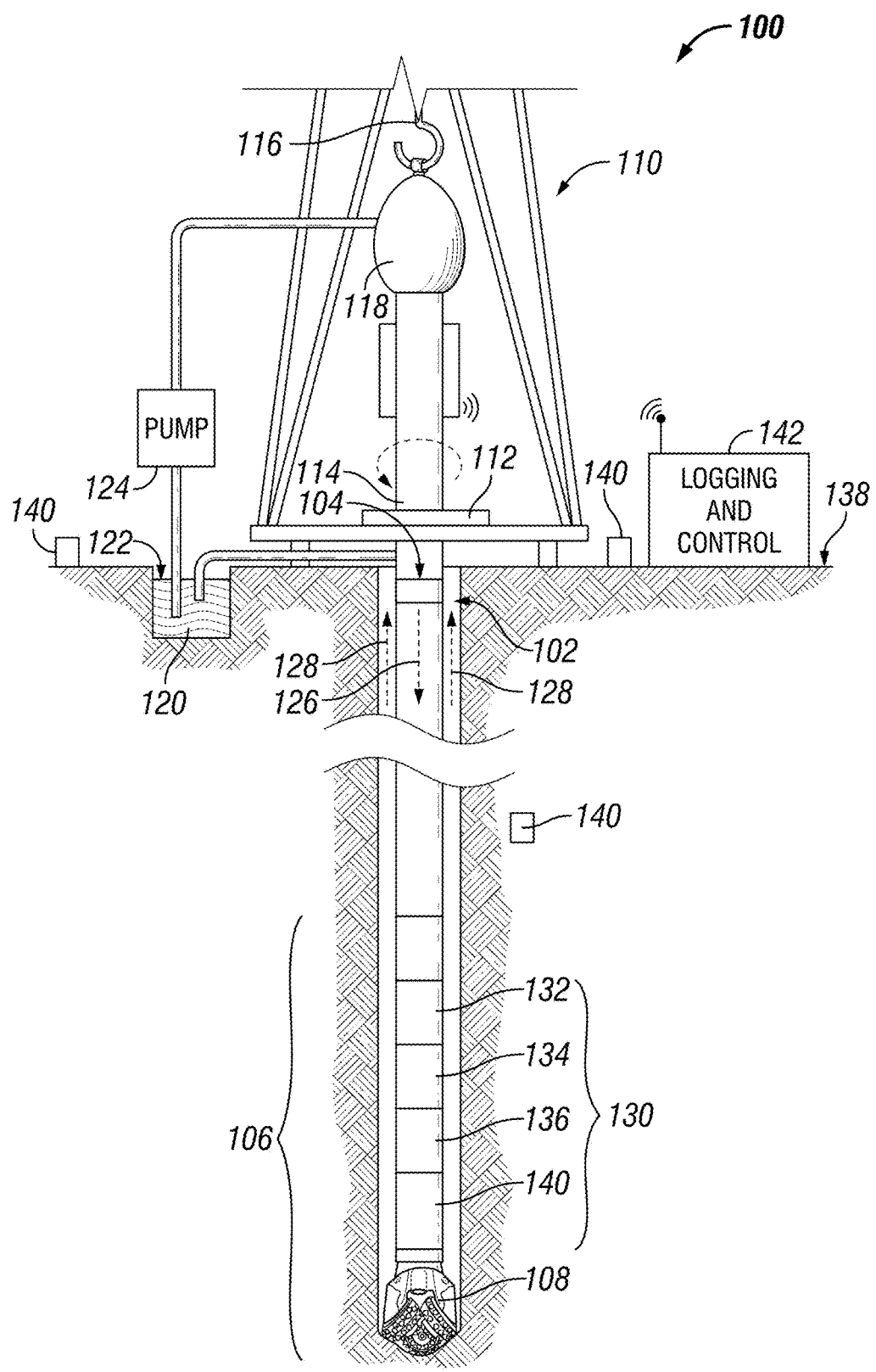
FIG. 1 illustrates an example wellsite in which embodiments of sensor array noise reduction can be employed.

FIG. 1 illustrates a wellsite 100 in which embodiments of sensor array noise reduction can be employed. Wellsite 100 can be onshore or offshore. In this example system, a borehole 102 is formed in a subsurface formation by rotary drilling in a manner that is well known. Embodiments of sensor array noise reduction can also be employed in association with wellsites where directional drilling is being conducted.

A drill string 104 is suspended within the borehole 102 and has a bottom hole assembly 106 which includes a drill bit 108 at its lower end. The surface system includes platform and derrick assembly 110 positioned over the borehole 102. The assembly 110 can include a rotary table 112, kelly 114, hook 116 and rotary swivel 118. The drill string 104 is rotated by the rotary table 112, energized by means not shown, which engages the kelly 114 at an upper end of the drill string 104. The drill string 104 is suspended from the hook 116, attached to a traveling block (also not shown), through the kelly 114 and a rotary swivel 118 which permits rotation of the drill string 104 relative to the hook 116. As is well known, a top drive system can also be used.

In the example of this embodiment, the surface system can further include drilling fluid or mud 120 stored in a pit 122 formed at the wellsite 100. A pump 124 delivers the drilling fluid 120 to the interior of the drill string 104 via a port in the swivel 118, causing the drilling fluid 120 to flow downwardly through the drill string 104 as indicated by the directional arrow 126. The drilling fluid 120 exits the drill string 104 via ports in the drill bit 108, and then circulates upwardly through the annulus region between the outside of the drill string and the wall of the borehole 102, as indicated by the directional arrows 128. In this well-known manner, the drilling fluid 120 lubricates the drill bit 108 and carries formation cuttings up to the surface as the drilling fluid 120 is returned to the pit 122 for recirculation.

The bottom hole assembly 106 of the illustrated embodiment can include drill bit 108 as well as a variety of equipment 130, including a logging-while-drilling (LWD) module 132, a measuring-while-drilling (MWD) module 134, a roto-steerable system and motor, various other tools, etc.

In one possible implementation, the LWD module 132 can be housed in a special type of drill collar, as is known in the art, and can include one or more of a plurality of known types of logging tools (e.g., a nuclear magnetic resonance (NMR system), a directional resistivity system, and/or a sonic logging system). It will also be understood that more than one LWD and/or MWD module can be employed (e.g. as represented at 136). (References, throughout, to a module at the position of 132 can also mean a module at the position of 136 as well.) The LWD module 132 can include capabilities for measuring, processing, and storing information, as well as for communicating with the surface equipment.

The MWD module 134 can also be housed in a special type of drill collar, as is known in the art, and include one or more devices for measuring characteristics of the well environment, such as characteristics of the drill string and drill bit. The MWD tool can further include an apparatus (not shown) for generating electrical power to the downhole system. This may include a mud turbine generator powered by the flow of the drilling fluid 120, it being understood that other power and/or battery systems may be employed. The MWD module 134 can include one or more of a variety of measuring devices known in the art including, for example, a weight-on-bit measuring device, a torque measuring device, a vibration measuring device, a shock measuring device, a stick slip measuring device, a direction measuring device, and an inclination measuring device.

Various embodiments of the present disclosure are directed to systems and methods for transmitting information (data and/or commands) from equipment 130 to a surface 138 of the wellsite 100. In one implementation, the information can be received by one or more sensors 140. The sensors 140 can be located on, above, or below the surface 138 in a variety of locations. In one possible implementation, placement of sensors 140 can be independent of precise geometrical considerations. Sensors 140 can be chosen from any sensing technology known in the art, including those capable of measuring electric or magnetic fields, including electrodes (such as stakes), magnetometers, coils, etc.

In one possible implementation, the sensors 140 receive information including LWD data and/or MWD data, which can be utilized to steer the drill 108 and any tools associated therewith. In one implementation the information received by the sensors 140 can be filtered to decrease and/or cancel noise at a logging and control system 142. Logging and control system 142 can be used with a wide variety of oilfield applications, including logging while drilling, artificial lift, measuring while drilling, etc. Also, logging and control system 142 can be located at surface 138, below surface 138, proximate to borehole 102, remote from borehole 102, or any combination thereof.

Alternately, or additionally, the information received by the sensors 140 can be filtered to decrease and/or cancel noise at one or more other locations, including any configuration known in the art, such as in one or more handheld devices proximate and/or remote from the wellsite 100, at a computer located at a remote command center, in the logging and control system 142 itself, etc.

Figure 2:
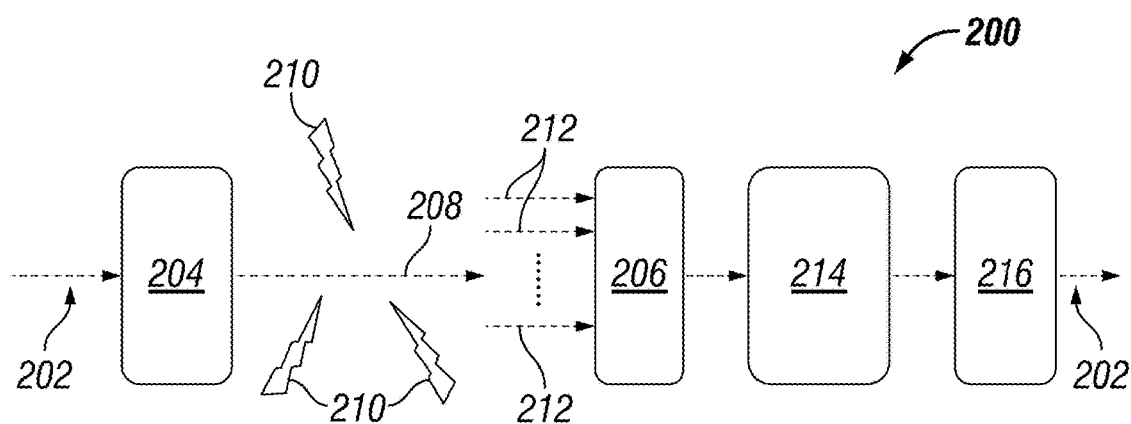
FIG. 2 illustrates an example global uplink chain that can be used with implementations of sensor array noise reduction.

FIG. 2 illustrates an example global uplink chain 200 that can be used in conjunction with implementations of sensor array noise reduction. In one possible implementation, information 202 is collected or produced by equipment, such as equipment 130. In one possible aspect, information 202 can be represented as binary information.

Information 202 can be modulated at a modulator 204 and transmitted to a demodulator 206. In one possible embodiment, modulator 204 produces a signal 208, such as an electromagnetic signal including information 202 that can be transmitted using any method and equipment known in the art. Signal 208 can be susceptible to one or more noise sources 210 during transmission. Noise sources 210 can include a wide variety of devices associated with electromagnetic energy such as, for example, mud motors, well heads, AC units, vehicles, welding operations, consumer electronics, electric perturbations from external sources for which no direct mitigation can be achieved, etc.

In one possible implementation, signal 208 with accompanying noise is received by sensors, such as sensors 140. The sensors provide measurements 212 corresponding to signal 208 with accompanying noise, to demodulator 206. Signal 208 with accompanying noise from noise sources 210, is demodulated at demodulator 206. In one possible aspect, a sensor array noise reduction manager 214 can be employed to apply the concepts of sensor array noise reduction to remove or reduce noise from demodulated signal 208 to produce a denoised signal. Information 202 can be decoded from the denoised signal by a symbol estimator 216 using any symbol estimation techniques known in the art.

Example Observation Model

Figure 3:
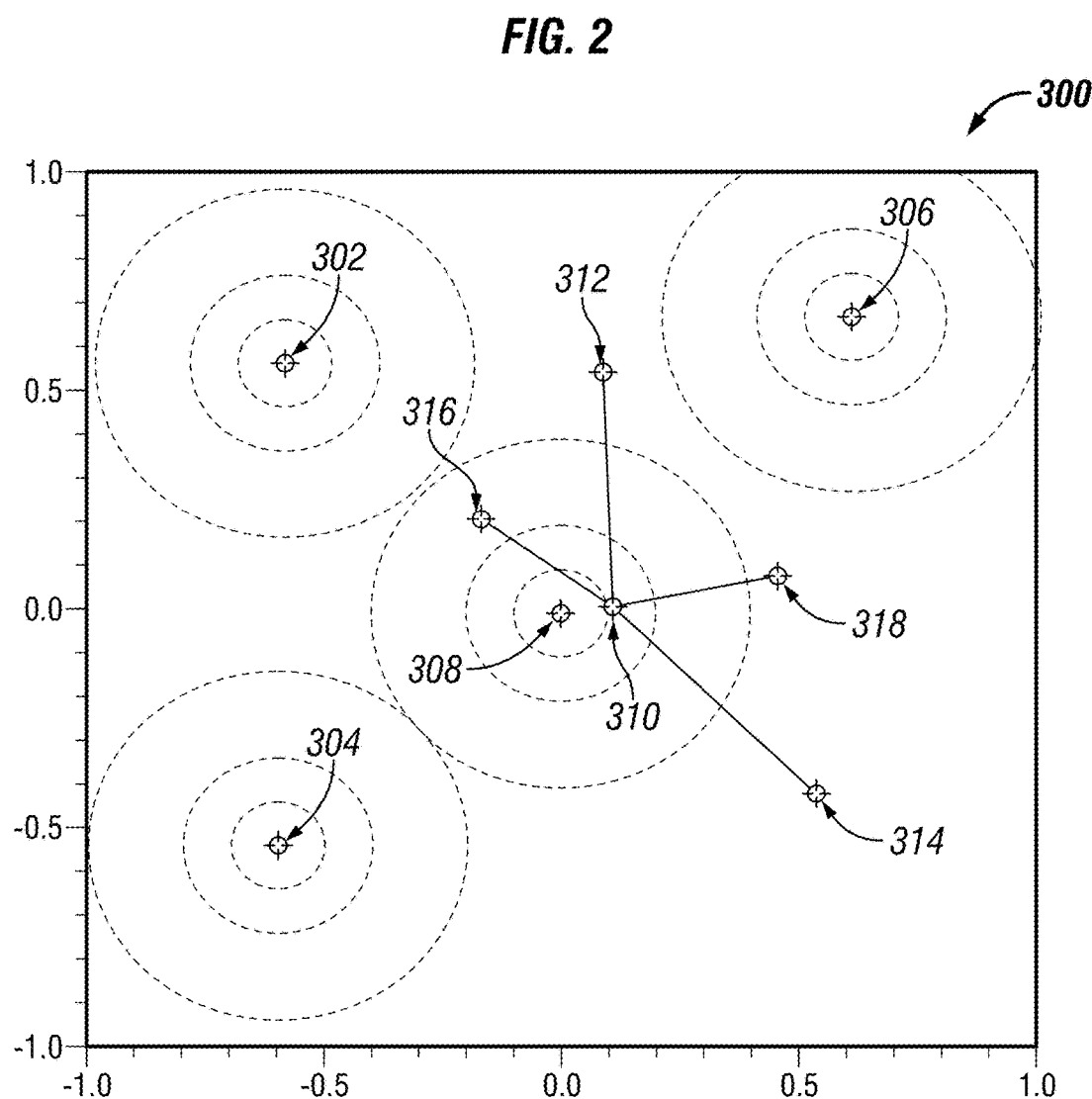
FIG. 3 illustrates an example observation model in accordance with implementations of sensor array noise reduction.

FIG. 3 illustrates an example observation model 300 in accordance with implementations of sensor array noise reduction. As shown, four electromagnetic sources 302, 304, 306, and 308 are present, though it will be understood that more or fewer electromagnetic sources can also be used. Electromagnetic sources 302-308 can be represented by "$so_1(t)$", "$so_2(t)$", "$so_3(t)$" and "$so_4(t)$", respectively, where t is the time.

In one possible implementation, source 302 can be a telemetry source producing a signal to be extracted while sources 304-308 can be noise sources. Measurement of the signal from source 302 can be achieved using sensors 140, such as metal rods, coils, magnetometers, or any measurement device sensitive to an electric or magnetic field. In one possible implementation, the measurements can be obtained by amplification of the difference of electric potential measured between a "ref" sensor 310 (denotable as ref(t)) and other sensors 312, 314, 316, 318 (which can be denoted respectively as "$se_1(t)$", "$se_2(t)$", "$se_3(t)$", "$se_4(t)$") such that a voltage $v_i(t)$ measured at surface 138 can be proportional to a difference of potential $v_i(t)=G\cdot(se_i(t)-ref(t))$, where G is a measurement gain.

In one possible implementation, any signal obtained at surface 138 which is proportional to the electric or magnetic field on a surface location or proportional to the difference of the electric field or magnetic field between two surface locations can be denoted as $v_i(t)$.

In one possible aspect, according to the superposition principle, the relationship between the signals measured and the sources can be written as the following linear relationship:

$$\begin{bmatrix} v_1(t) \\ \vdots \\ v_i(t) \end{bmatrix} = \begin{bmatrix} m_{11} & \cdots & m_{1j} \\ \vdots & & \vdots \\ m_{i1} & \cdots & m_{ij} \end{bmatrix} \begin{bmatrix} so_1(t) \\ \vdots \\ so_j(t) \end{bmatrix}$$

If the mixing matrix $[m_{ij}]$ is invertible, the sources can be recovered using the inverse matrix (or pseudoinverse in the case i>j) as follows:

$$\begin{bmatrix} so_1(t) \\ \vdots \\ so_j(t) \end{bmatrix} = \begin{bmatrix} m_{11} & \cdots & m_{1j} \\ \vdots & & \vdots \\ m_{i1} & \cdots & m_{ij} \end{bmatrix}^+ \begin{bmatrix} v_1(t) \\ \vdots \\ v_i(t) \end{bmatrix}$$

$$= \begin{bmatrix} d_{11} & \cdots & d_{1i} \\ \vdots & & \vdots \\ d_{j1} & \cdots & d_{ji} \end{bmatrix} \begin{bmatrix} v_1(t) \\ \vdots \\ v_i(t) \end{bmatrix}$$

In one possible embodiment, the symbol "+" can denote either the inverse matrix (if i=j) or the pseudoinverse matrix (if i>j). In one possible implementation, the matrix $[d_{ji}]$ can be called the demixing matrix.

In one possible embodiment, the electromagnetic source $so_1$ can be recovered using the different measurements $v_i$, the first line $[d_{1j}]$ of the demixing matrix, and the source $so_1(t)$ can be recovered using following equation $$so_1(t) = \sum_{k=1}^{i} d_{1k} \cdot v_k(t)$$

The vector $[d_{1i}]$ can be referred to as the "demixing vector".

Example Problem Formulation

In one possible implementation, at surface 138 one or more measurements $v_i(t)$ from sensors 140 can be converted to a constellation space using demodulation (such as low-pass filtering and/or downsampling) at the rate of one sample per symbol. The samples obtained from the measurement $v_i(t)$ at the end of this procedure can be denoted $z_i[n]$ where n is the symbol index.

For example, in the constellation domain, the samples of the telemetry signal may be concentrated around the constellation centers of the modulation.

Figure 4:
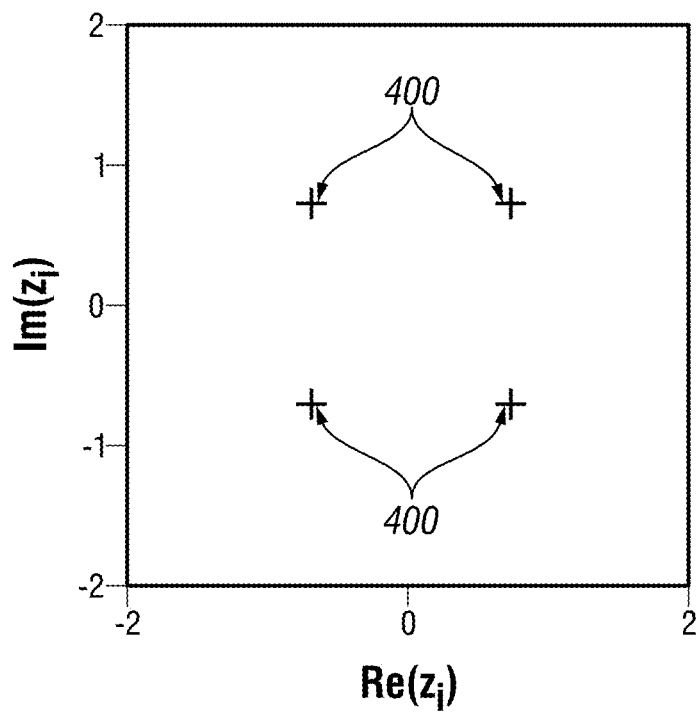
FIG. 4 illustrates example constellation centers which might be expected in a QPSK modulation in accordance with various implementations of sensor array noise reduction.

FIG. 4 shows example constellation centers 400 which might be expected in one implementation of sensor array noise reduction for a Quadrature Phase-Shift Keying (QPSK) modulation. In FIG. 4, four constellation centers 400 are shown, however it will be understood that more or less constellation centers can also be used.

Figure 5:
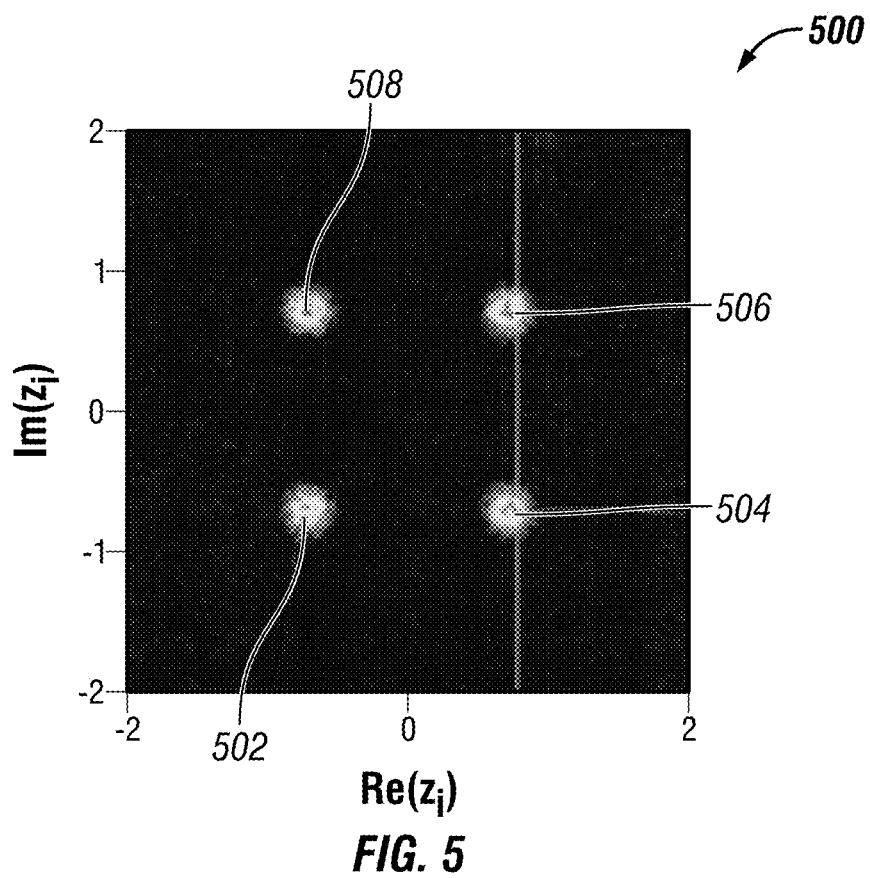
FIG. 5 illustrates an example probability density function of a clean telemetry signal where no noise is present in accordance with various implementations of sensor array noise reduction.

FIG. 5 illustrates an example probability density function 500 of a clean signal, such as a telemetry signal, where no noise is present in accordance with implementations of sensor array noise reduction. Symbols 502, 504, 506, 508 are distributed in the neighborhood of the constellation centers 400.

Figure 6:
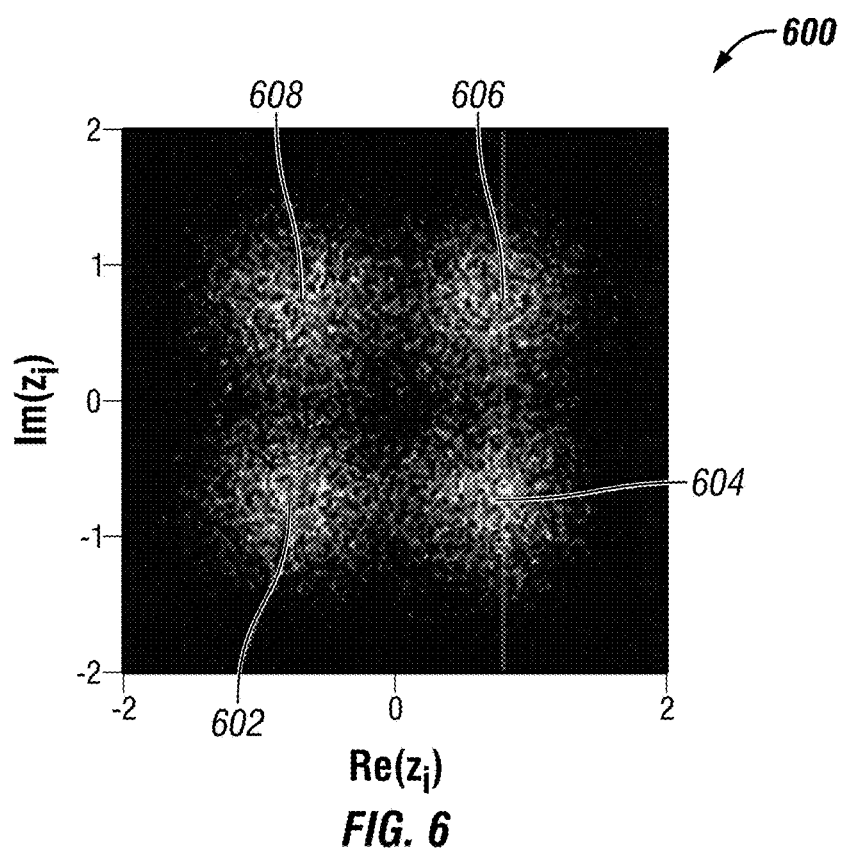
FIG. 6 illustrates an example probability distribution function of a telemetry signal corrupted by noise in accordance with various implementations of sensor array noise reduction.

FIG. 6 illustrates an example probability distribution function 600 of a signal corrupted by noise in accordance with implementations of sensor array noise reduction. Symbols 602, 604, 606, 608 are spread around the constellation centers 400, causing a number of symbol errors.

Figure 7:
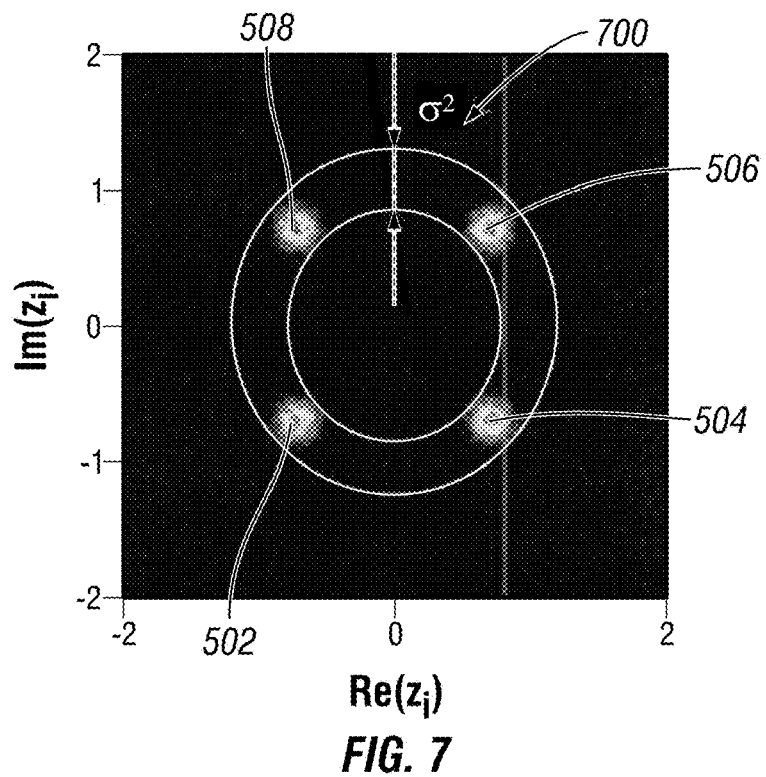
FIG. 7 illustrates example metrics for PSK modulations including annular variance dispersion metrics in accordance with various implementations of sensor array noise reduction.
Figure 8:
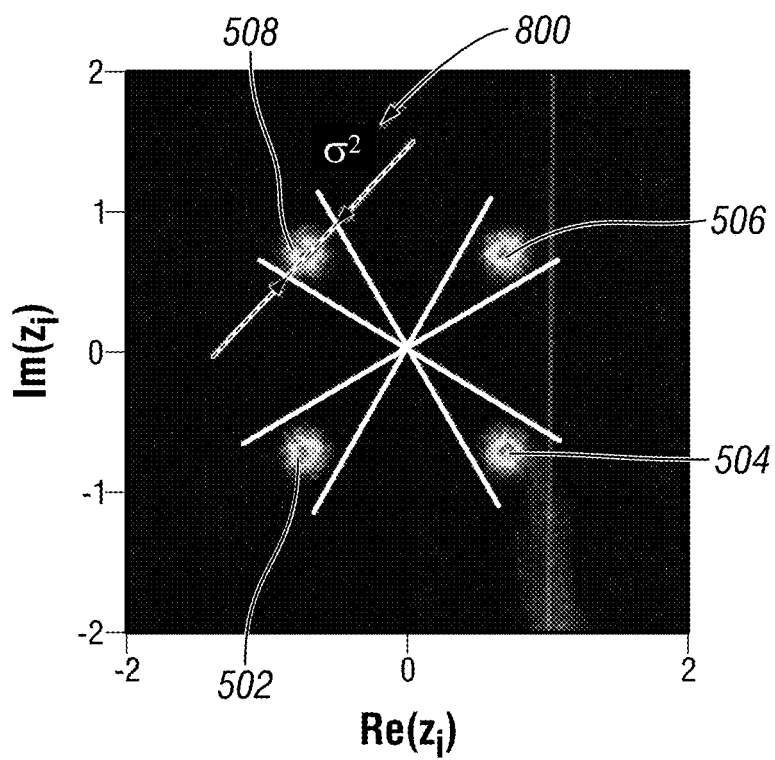
FIG. 8 illustrates example metrics for PSK modulations including angular variance dispersion metrics in accordance with various implementations of sensor array noise reduction.
Figure 9:
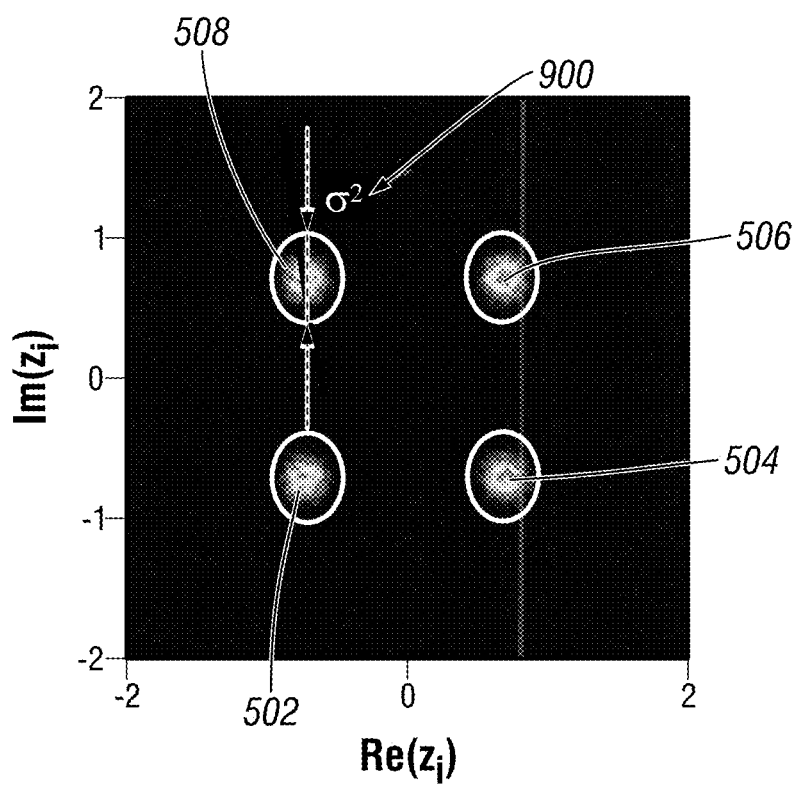
FIG. 9 illustrates example metrics for PSK modulations including constellation variance dispersion metrics in accordance with various implementations of sensor array noise reduction.

In one possible implementation, the dispersion of the symbols around the theoretical constellation centers 400 can be measured quantitatively using one or more statistical metrics, such as variance, standard deviation and/or higher order statistics. Examples of such metrics for Phase-Shift Keying (PSK) modulations include annular variance 700, angular variance 800 and constellation variance 900 dispersions metrics which are shown in FIG. 7, FIG. 8 and FIG. 9, respectively. In one possible embodiment, given a signal $z_i[n]$, for any modulation it may be possible to define a statistical dispersion metric 700, 800, 900 referred as disp $(z_i[n])$.

As an illustrative example of one possible implementation, the biased annular variance of a telemetry signal $z_i[n]$ modulated using a member of the PSK family may be given by:

$$\sigma = disp(z_i[n])$$

$$= \sqrt{\sum_n (|z_i[n]|-1)^2}$$

In one possible implementation, noise reduction in, for example, EMAG telemetry can be formulated as the following reduction and/or minimization exercise under constraint:

$$\begin{cases} [\hat{d}_1 \ldots \hat{d}_i] = \underset{[d_1 \ldots d_i]}{\operatorname{argmin}} \ disp\left(\sum_{k=1}^{i} d_k \cdot z_k[n]\right) \\ \text{under the constraint } \left|\sum_{k=1}^{i} d_k \cdot z_k[n]\right| = c \end{cases}$$

where the constant c can be set to c=1. In one possible aspect, the demixing vector can be solved for to decrease the dispersion of the symbols 602, 604, 606, 608 around the constellation centers 400. In one possible aspect, this global search can be solved using one or more of numerous local or global optimization algorithms, including:

Deterministic or stochastic gradient descent
Monte-carlo minimization
Bayesian optimization Once the demixing vector is found at the end of the global procedure (which in one aspect may be run towards optimization), in one possible aspect the denoised symbols $z_d[n]$ can be obtained using the following equation $$z_d[n] = \sum_{k=1}^{i} \hat{d}_k \cdot z_k[n]$$

Example Reduction of Search Space

In one possible embodiment, it may be possible to use the constraint term $|\Sigma_{k=1}^{i} d_k \cdot z_k[n]| = c$ to reduce the dimension of the search space to improve the efficiency of the global search. In one possible aspect, an observation matrix Z can be defined as $$Z = \begin{bmatrix} z_1[n] & \ldots & z_1[n+m] \\ \vdots & & \vdots \\ z_i[n] & \ldots & z_i[n+m] \end{bmatrix}$$

And the demixing vector d can be defined as $$d = [d_1 \ldots d_i]$$

With these notations, one can write $$\left| \sum_{k=1}^{i} d_k \cdot z_k[n] \right|^2 = dZZ^T d^T$$

In one implementation the matrix $ZZ^T$ can be symmetric and be decomposed using singular value decomposition such that $$ZZ^T = (S\sqrt{V})(S\sqrt{V})^T$$

Where V is the diagonal matrix containing the positive singular values of $ZZ^T$ and where S is a matrix with same size as Z. The number of elements on the diagonal can be reduced by keeping the r singular values higher than some threshold, and the reduced matrix containing these elements can be denoted as $V_r$. In a similar fashion, the reduced matrix $S_r$ can include the first r columns of the matrix S.

In one possible implementation, one assumption behind the use of the reduced matrices $V_r$ and $S_r$ can be that if the threshold is small enough, then one can show that $$d \sim d_n \cdot (S_r \sqrt{V_r})^+$$

In one aspect, the normalized vector $d_n$ of size r can verify the condition $d_n \cdot d_n^T = c$ which defines the equation of an r-dimensional sphere with radius c. One or more points at the surface of an r-dimensional sphere with constant radius can be expressed using r distinct Cartesian coordinates and/or indifferently by using (r−1) spherical coordinates. Defining the spherical coordinates vector $\Phi = [\phi_1 \ldots \phi_{r-1}]$, $\phi_1 \ldots \phi_{r-1} \in [0, 2\pi[$ and T(.) as the spherical to Cartesian transformation such that $d_n = T(\Phi)$, the initial search problem can be rewritten as follows $$\begin{cases} \hat{\Phi} = \min_{\Phi} disp(T(\Phi) \cdot (S_r \sqrt{V_r})^+) \\ [\hat{d}_i] = T(\hat{\Phi}) \end{cases}$$

With this reduced formulation, the size of the search space can have (r−1) variables while the initial formulation can have i different variables.

Example of Sparse Decomposition Process

In some implementations, more than one demixing vector can be found for the same observation matrix. In such cases, a global reduction (including potentially a minimum) can be estimated during the search phase along with various different local lows (including minimums). This can be done using, for example:

A brute force process—During the search phase, the potential vector candidates can be tested and vectors corresponding to a decrease (including a minima) of the dispersion metric can be kept in a list while other vectors can be discarded a basis pursuit process—A search of a global decrease can be carried out in accordance with known procedures in the art. Once the demixing vector is found, the inner product $\alpha_i = \langle z_i[n], z_d[n] \rangle$ between the denoised signal $z_d[n]$ and the signal $z_i[n]$ can be estimated. The residual $z_i^r[n] = z_i[n] - \alpha_i z_d[n]$ can be estimated for each signal $z_i[n]$, and the residual observation matrix $Z^r$ can formed. A new search of the global high (including a possible maximum) can be carried out using the residual $Z^r$ instead of Z. In one possible implementation, this process of estimation-subtraction can be iterated until a desired decomposition order is achieved.

Example Methods

Figure 10:
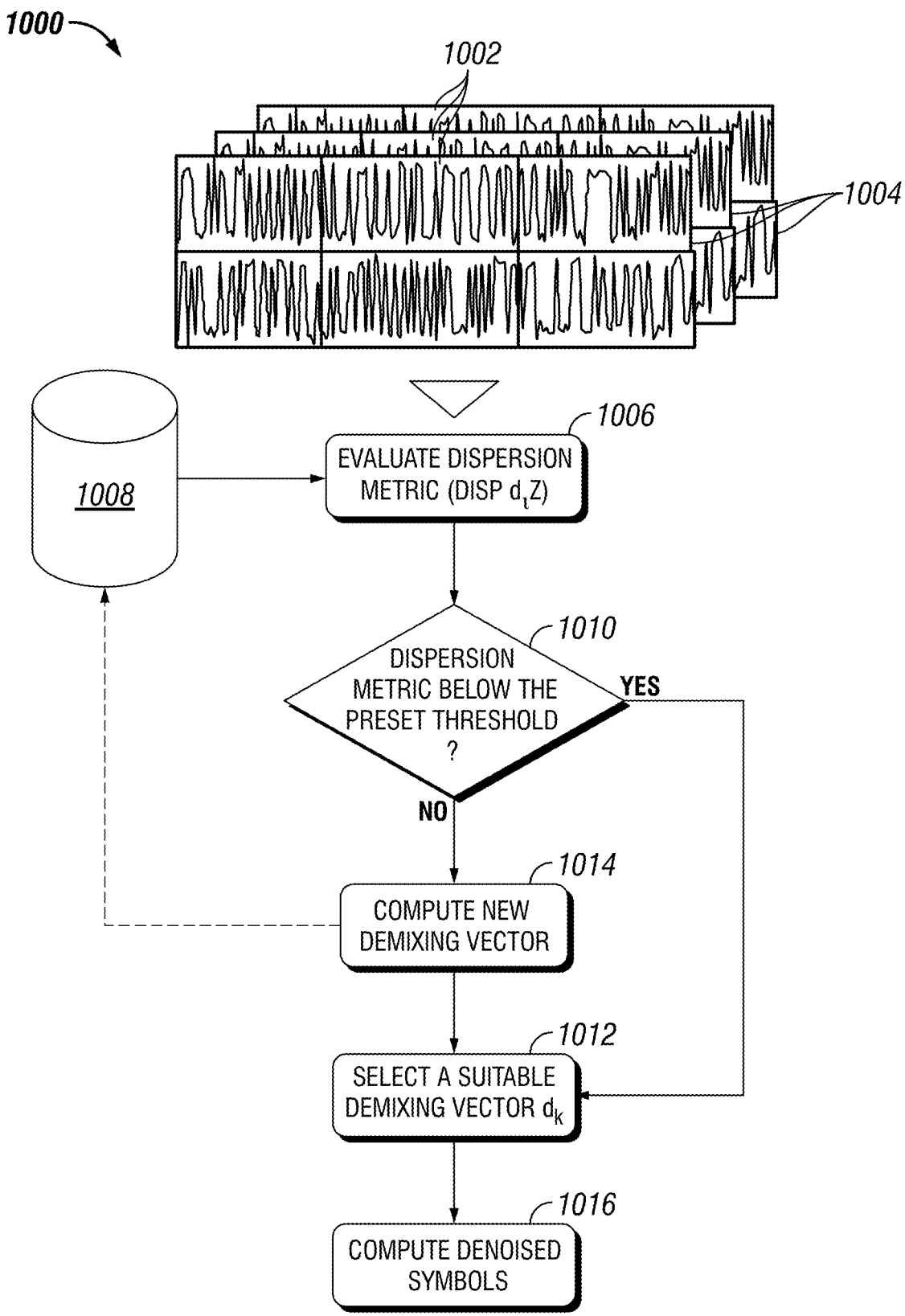
FIG. 10 illustrates an example method associated with sensor array noise reduction.
Figure 11:
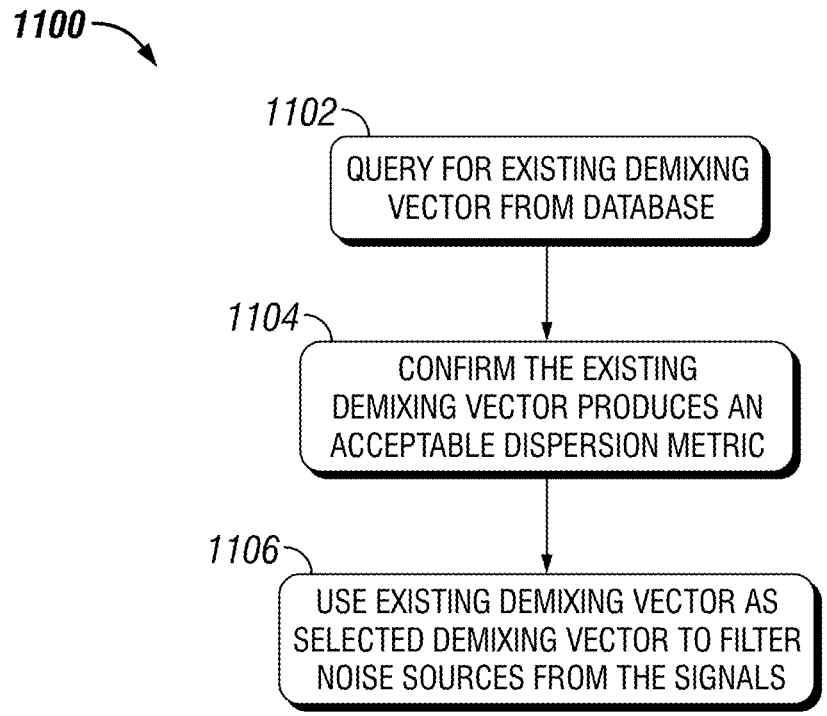
FIG. 11 illustrates an example method associated with sensor array noise reduction.
Figure 12:
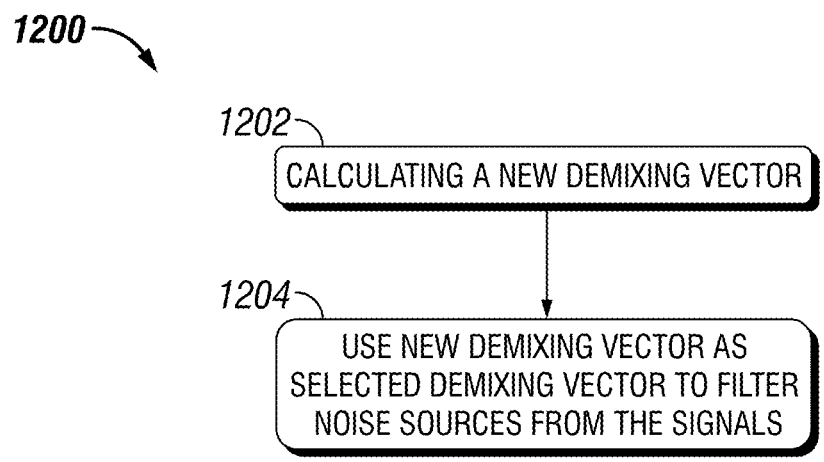
FIG. 12 illustrates an example method associated with sensor array noise reduction.

FIGS. 10-12 illustrate example methods for implementing aspects of sensor array noise reduction. The methods are illustrated as a collection of blocks and other elements in a logical flow graph representing a sequence of operations that can be implemented in hardware, software, firmware, various logic or any combination thereof. The order in which the methods are described is not intended to be construed as a limitation, and any number of the described method blocks can be combined in any order to implement the methods, or alternate methods. Additionally, individual blocks and/or elements may be deleted from the methods without departing from the spirit and scope of the subject matter described therein. In the context of software, the blocks and other elements can represent computer instructions that, when executed by one or more processors, perform the recited operations. Moreover, for discussion purposes, and not purposes of limitation, selected aspects of the methods may described with reference to elements shown in FIGS. 1-9.

It will be understood that computations in sensor array noise reduction, including those discussed in FIGS. 10-12, can be done in baseband and/or at the rate of carrier's frequency. Further, it will be understood that a variety of frame structures and error correcting codes known in the art can be used. Further, a nature of modulation used may also be accounted for, i.e. a probability density function of the modulation can be utilized to provide information to discriminate a desired signal from noise in sensor array noise reduction. Moreover a linear combination of all measurements made, such as measurements made by sensors 140, may be used in sensor array noise reduction to generate a denoised signal.

FIG. 10 illustrates an example data learning method 1000 that can be used with embodiments of sensor array noise reduction. As shown, an observation matrix Z can be formed from samples 1002 of signals $z_i[n]$ 1004, such as signals 208. Signals 1004 can include, for example, information received by sensors 140 and can already have been demodulated, such as by demodulator 206. In one implementation, matrix Z can be formed by taking at least some consecutive samples 1002. In one possible embodiment, a sliding window can be employed to access samples 1002 for use in estimating denoising parameters. In one aspect, the samples 1002 correspond in time (i.e. the samples are associated with measurements made by sensors 140 during the same time frame).

At block 1006, a dispersion metric such as disp($z_i[n]$), can be accessed and estimated. In one possible implementation, the dispersion metric can be estimated for one or more demixing vectors, such as demixing vectors {d_i}, in a demixing vector database, such as database 1008. This can include examining a spread of samples 1002 relative to constellations centers, such as centers 400. In one possible aspect, a list of demixing vectors used in previous sensor array noise reduction activities saved in demixing vector database 1008 can be utilized.

At block 1010, if the value of a dispersion metric is below a preset threshold (such as a performance threshold), a suitable demixing vector, such as demixing vector $d_k$, providing an acceptable dispersion metric value can be selected at block 1012. In one possible embodiment, the demixing vector $d_k$ selected can be one providing a dispersion metric value below a preset threshold. In one possible aspect this can include selecting $d_k$ to minimize disp($d_k \cdot Z$).

If the value of the dispersion metric examined at block 1010 is above a preset threshold, at block 1014 one or more new demixing vectors can be estimated using matrix Z. The one or more new demixing vectors can be calculated using a variety of methods known in the art including, for example, global search and sparse decomposition processes (including brute force and basis pursuit). In one possible aspect, complete and/or reduced formulations can be used in these calculations.

In one possible implementation, demixing vector database 1008 can be updated to include at least some of the new vectors calculated at block 1014. In one aspect, older vectors can be removed from database 1008, such as, for example, when new vectors are added to database 1008.

At block 1016, denoised symbols $Z_d = d_k Z$ can be calculated using, for example, one or more demixing vectors $d_k$ selected at block 1012 and/or computed at block 1014. In one possible implementation, denoised symbols $Z_d = d_k Z$ can be decoded by a telemetry receiver configured to decode data symbols, such as symbol estimator 216.

It will be understood that in one possible embodiment, a loop can be formed between blocks 1006, 1010, 1014 and 1008 allowing method 1000 to evaluate one or more of the demixing vectors in database 1008. If a demixing vector cannot be found in database 1008 that produces a dispersion metric below the preset threshold in block 1010, method 1000 can compute a new demixing vector at 1014. Method 1000 can then select the newly calculated demixing vector, such as at block 1012, if the newly calculated demixing vector produces a dispersion metric that is better than the dispersion metrics produced by the demixing vectors evaluated from database 1008. In one aspect, to avoid an infinite loop between 1006-1014, the newly calculated demixing vector can be selected as the suitable demixing vector when the demixing vectors evaluated (including the newly calculated demixing vector and the demixing vectors from database 1008) produce dispersion metrics above the preset threshold. In such a case the newly calculated demixing vector is presented to block 1016.

It will also be understood that in some possible implementations, one or more demixing vectors can be calculated on the fly without querying for demixing vectors from database 1008. For example, in one aspect, on initial startup, database 1008 may be empty, so method 1000 may go directly to 1014 to compute one or more new demixing vectors. In another possible aspect, database 1008 may be absent or inaccessible. In another possible aspect, method 1000 may choose to ignore database 1008 and calculate new demixing vectors rather than query for demixing vectors from database 1008.

It will be further understood that In one possible embodiment, one or more demixing vectors can be applied to samples 1002 that correspond in time.

FIG. 11 illustrates an example method 1100 for selecting and using a demixing vector in accordance with implementations of sensor array noise reduction.

At block 1102, an existing demixing vector, such as demixing vector {d_i}, is queried from a database, such as demixing vector database 1008.

At block 1104, the existing demixing vector is examined to confirm that it produces an acceptable dispersion metric. In one possible implementation, the demixing vector can be examined to confirm that it produces an acceptable dispersion metric with a set of signal samples, such as samples 1002. Stated another way for the sake of clarity, the demixing vector can be applied to portions of signals from a variety of sensors that correspond in time (i.e. portions that were produced by the sensors during the same time frame). In one possible embodiment, an acceptable dispersion metric is one that falls below a preset threshold.

At block 1106, once the existing demixing vector is confirmed to produce an acceptable dispersion metric, the exisiting demixing vector is used as a selected demixing vector to filter noise contributed by noise sources, such as noise sources 210, from a signal, such as signal 1004, to arrive at a clearer signal, such as signal 208. In one implementation, the demixing vector improves a signal to noise ratio in the signal.

FIG. 12 illustrates another example method 1200 in accordance with sensor array noise reduction.

At block 1202, a new demixing vector is calculated. In one possible implementation, the new demixing vector can be calculated on the fly without previously querying for demixing vectors from a database, such as database 1008. In one implementation, the new demixing vector can be estimated using matrix Z and be calculated using operations similar to those discussed above in conjunction with block 1014. For example, the new demixing vector can be calculated using a variety of methods known in the art including, for example, global search and sparse decomposition processes (including brute force and basis pursuit). In one possible aspect, complete and/or reduced formulations can be used.

At block 1204 the new demixing vector can be used as a selected demixing vector to filter noise sources from a signal being denoised, such as signal 1004. For example, the demixing vector can be applied to portions of signals, such as samples 1002, from a variety of sensors, such as sensors 140, wherein the samples correspond in time (i.e. the samples are portions of signals that were produced by the sensors during the same time frame). In one implementation, the new demixing vector can be saved to a database, such as demixing vector database 1008, for possible use in future denoising operations.

Example Computing Device

Figure 13A:
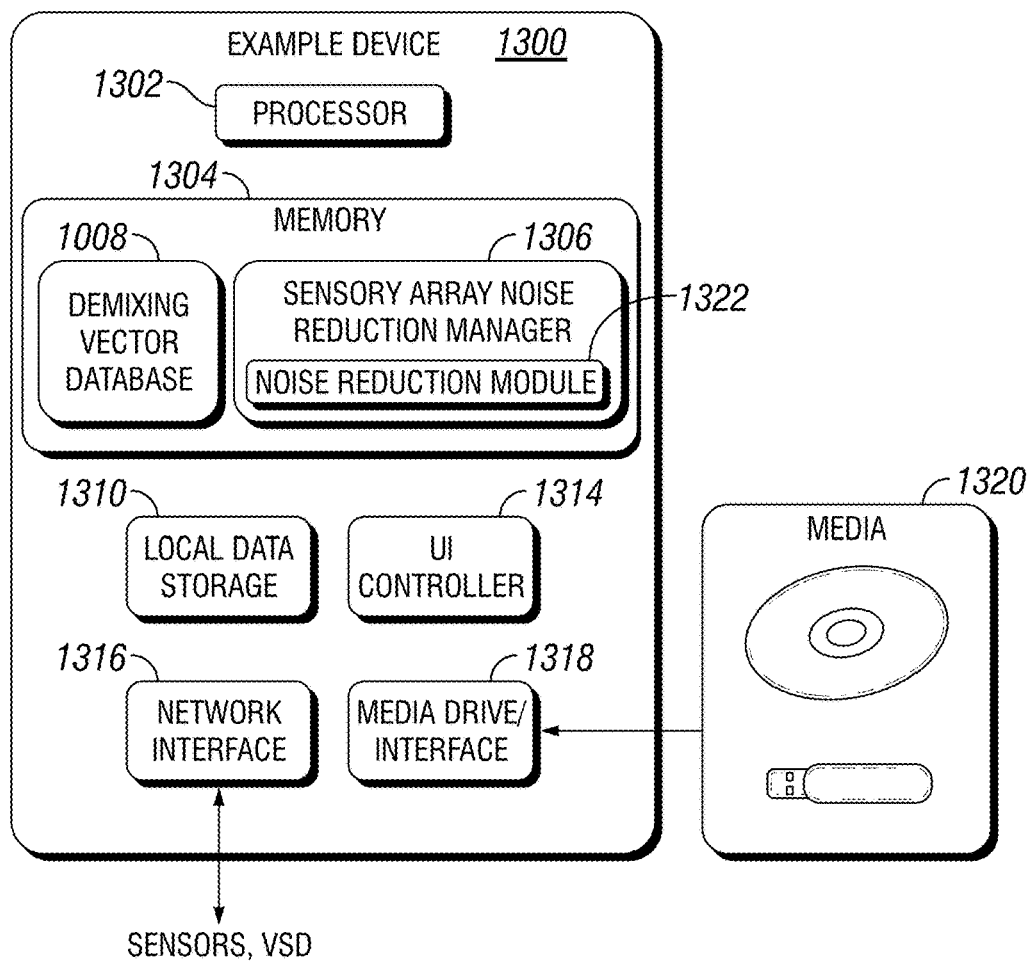
FIGS. 13A and 13B illustrate example computing devices that can be used in accordance with various implementations of sensor array noise reduction.

FIG. 13A shows an example device 1300, with a processor 1302 and memory 1304 for hosting a sensor array noise reduction manager 1306 configured to implement various embodiments of sensor array noise reduction as discussed in this disclosure. Memory 1304 can also host one or more databases, such as demixing vector database 1008, and can include one or more forms of volatile data storage media such as random access memory (RAM)), and/or one or more forms of nonvolatile storage media (such as read-only memory (ROM), flash memory, and so forth).

Device 1300 is one example of a computing device or programmable device, and is not intended to suggest any limitation as to scope of use or functionality of device 1300 and/or its possible architectures. For example, device 1300 can comprise one or more computing devices, programmable logic controllers (PLCs), etc.

Further, device 1300 should not be interpreted as having any dependency relating to one or a combination of components illustrated in device 1300. For example, device 1300 may include one or more of a computer, such as a laptop computer, a desktop computer, a mainframe computer, etc., or any combination or accumulation thereof.

Figure 13B:
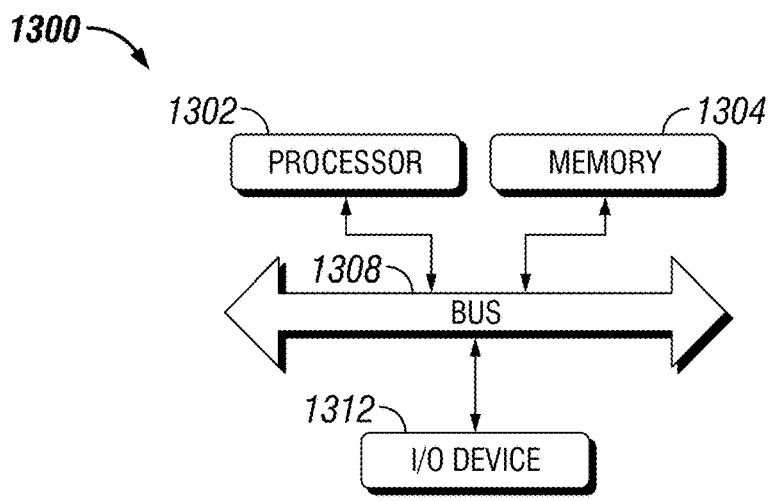

As shown in FIG. 13B, device 1300 can also include a bus 1308 configured to allow various components and devices, such as processors 1032, memory 1304, and local data storage 1310, among other components, to communicate with each other. Bus 1308 can include one or more of any of several types of bus structures, including a memory bus or memory controller, a peripheral bus, an accelerated graphics port, and a processor or local bus using any of a variety of bus architectures. Bus 1308 can also include wired and/or wireless buses.

Local data storage 1310 can include fixed media (e.g., RAM, ROM, a fixed hard drive, etc.) as well as removable media (e.g., a flash memory drive, a removable hard drive, optical disks, magnetic disks, and so forth).

A input/output (I/O) device 1312 may also communicate via a user interface (UI) controller 1314, which may connect with I/O device 1312 either directly or through bus 1308.

In one possible implementation, a network interface 1316 may communicate outside of device 1300 via a connected network, and in some implementations may communicate with hardware, such as one or more sensors 140, etc.

In one possible embodiment, sensors 140 may communicate with system 1300 as input/output devices 1312 via bus 1308, such as via a USB port, for example.

A media drive/interface 1318 can accept removable tangible media 1320, such as flash drives, optical disks, removable hard drives, software products, etc. In one possible implementation, logic, computing instructions, and/or software programs comprising elements of the sensor array noise reduction manager 1306 may reside on removable media 1320 readable by media drive/interface 1318.

In one possible embodiment, input/output devices 1312 can allow a user to enter commands and information to device 1300, and also allow information to be presented to the user and/or other components or devices. Examples of input devices 1312 include, for example, sensors, a keyboard, a cursor control device (e.g., a mouse), a microphone, a scanner, and any other input devices known in the art. Examples of output devices include a display device (e.g., a monitor or projector), speakers, a printer, a network card, and so on.

In one possible implementation, sensor array noise reduction manager 1306 can include a noise reduction module 1322 configured to, for example, remove noise associated with one or more noise sources from a received signal through use of a demixing vector.

Various processes of sensor array noise reduction manager 1306 may be described herein in the general context of software or program modules, or the techniques and modules may be implemented in pure computing hardware. Software generally includes routines, programs, objects, components, data structures, and so forth that perform particular tasks or implement particular abstract data types. An implementation of these modules and techniques may be stored on or transmitted across some form of tangible computer-readable media. Computer-readable media can be any available data storage medium or media that is tangible and can be accessed by a computing device. Computer readable media may thus comprise computer storage media. "Computer storage media" designates tangible media, and includes volatile and non-volatile, removable and non-removable tangible media implemented for storage of information such as computer readable instructions, data structures, program modules, or other data. Computer storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other tangible medium which can be used to store the desired information, and which can be accessed by a computer.

Although a few embodiments of the disclosure have been described in detail above, those of ordinary skill in the art will readily appreciate that many modifications are possible without materially departing from the teachings of this disclosure. Accordingly, such modifications are intended to be included within the scope of this disclosure as defined in the claims.

The invention claimed is:

1. A logging and control system, comprising:
   a sensor array noise reduction manager configured to:
   receive measurements from two or more sensors configured to detect an electromagnetic telemetry signal;
   convert the measurements into symbols in a constellation domain;
   measure a dispersion of the symbols around one or more constellation centers in the constellation domain;
   determine a demixing vector based on the dispersion; and
   apply the demixing vector to filter one or more noise sources from the measurements and improve a signal to noise ratio of the electromagnetic telemetry signal in the measurements.

2. The system of claim 1, wherein the two or more sensors comprise electrode sensors.

3. The system of claim 1, wherein the sensor array noise reduction manager is configured to:
   receive the measurements from sensors located at a surface of a wellsite.

4. The system of claim 1, wherein the sensor array noise reduction manager is configured to:
   store the demixing vector in a database;
   receive second measurements from two or more other sensors; and
   calculate a dispersion metric of the demixing vector received from a database, and apply the demixing vector to filter one or more noise sources from the second measurements when the dispersion metric is below a preset threshold.

5. The system of claim 1, wherein the sensor array noise reduction manager is configured to calculate the demixing vector iteratively using global search.

6. The system of claim 1, wherein the sensor array noise reduction manager is configured to calculate the demixing vector iteratively using one or more of:
   a sparse decomposition process; or
   a brute force process.

7. The system of claim 1, wherein the sensor array noise reduction manager is configured to reduce a size of a search space by singular value decomposition and polar transformation of the measurements.

8. The system of claim 1, wherein the sensor array noise reduction manager is configured to filter the one or more noise sources from the measurements simultaneously.

9. The system of claim 1, wherein the sensor array noise reduction manager is configured to filter up to N−1 noise sources from measurements of N sensors simultaneously.

10. The logging and control system of claim 1, wherein the logging and control system is configured to determine one or more drilling parameters of a well based on data represented by the measurements.

11. The logging and control system of claim 1, further comprising:
the two or more sensors configured to detect the electromagnetic signal;
a measuring device positioned in a wellbore; and
a telemetry device in communication with the measuring device, wherein the telemetry device is configured to emit a signal representative of the electromagnetic signal that is received by the two or more sensors.

12. A method for increasing a signal to noise ratio of a received electromagnetic signal, comprising:
receiving, at a sensor interface, measurements associated with an operating condition from two or more sensors, the measurements being included in the received electromagnetic signal;
converting the measurements into symbols in a constellation domain;
measuring a dispersion of the symbols around one or more constellation centers in the constellation domain;
determining a demixing vector based on the dispersion; and
applying the demixing vector to the measurements to remove noise associated with one or more noise sources from the received electromagnetic signal.

13. The method of claim 12, further comprising querying for an existing demixing vector from a database.

14. The method of claim 12, determining the demixing vector comprises using one or more of:
a global search process; or
a sparse decomposition process.

15. The method of claim 12, wherein the demixing vector is determined on the fly.

16. The method of claim 12, further comprising:
storing the demixing vector in a database;
receiving second measurements from the two or more sensors;
calculating a dispersion metric of the demixing vector received from a database; and
applying the demixing vector to filter one or more noise sources from the second measurements when the dispersion metric is below a preset threshold.

17. The method of claim 12, further comprising using the measurements to steer a drill in a wellbore after applying the demixing vector.

18. The method of claim 12, further comprising transmitting measurements from a telemetry device in communication with a measuring device in a wellbore by emitting electromagnetic signals.

19. The method of claim 18, further comprising detecting the electromagnetic signals using the two or more sensors.

20. A computer-readable tangible medium with instructions stored thereon that, when executed, direct a processor to perform acts comprising:
receiving measurements collected by two or more sensors, the two or more sensors being configured to detect electromagnetic signals;
converting the measurements into symbols in a constellation domain;
measuring a dispersion of the symbols around one or more constellation centers in the constellation domain;
determining a demixing vector based on the dispersion; and
applying the demixing vector to filter one or more noise sources from the electromagnetic signals.

21. The computer-readable medium of claim 20, wherein determining the demixing vector comprises using one of more of:
a global search; and
a sparse decomposition.

22. The computer-readable medium of claim 20, wherein the acts further comprise:
storing the demixing vector in a database;
receiving second measurements from the two or more sensors;
calculating a dispersion metric of the demixing vector received from a database; and
applying the demixing vector to filter one or more noise sources from the second measurements when the dispersion metric is below a preset threshold.

* * * * *